United States Patent
Hori et al.

(10) Patent No.: US 11,689,172 B2
(45) Date of Patent: Jun. 27, 2023

(54) ASSEMBLY OF PIEZOELECTRIC MATERIAL SUBSTRATE AND SUPPORT SUBSTRATE, AND METHOD FOR MANUFACTURING SAID ASSEMBLY

(71) Applicant: NGK INSULATORS, LTD., Nagoya (JP)

(72) Inventors: Yuji Hori, Owariasahi (JP); Takahiro Yamadera, Nagoya (JP); Tatsuro Takagaki, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 412 days.

(21) Appl. No.: 16/900,310

(22) Filed: Jun. 12, 2020

(65) Prior Publication Data
US 2020/0313640 A1 Oct. 1, 2020

Related U.S. Application Data

(63) Continuation of application No. PCT/JP2018/041585, filed on Nov. 9, 2018.

(30) Foreign Application Priority Data

Dec. 28, 2017 (JP) .................................. 2017-252851

(51) Int. Cl.
*H03H 9/02* (2006.01)
*H03H 3/08* (2006.01)
(Continued)

(52) U.S. Cl.
CPC .......... *H03H 3/08* (2013.01); *H03H 9/02559* (2013.01); *H03H 9/02574* (2013.01);
(Continued)

(58) Field of Classification Search
CPC .......... H03H 9/02559; H03H 9/02574; H03H 9/02535
(Continued)

(56) References Cited

U.S. PATENT DOCUMENTS

| 10,014,162 B2 | 7/2018 | Taniguchi et al. |
| 2004/0226162 A1 | 11/2004 | Miura et al. |

(Continued)

FOREIGN PATENT DOCUMENTS

| JP | 2004358502 A | 12/2004 |
| JP | 3774782 B2 | 5/2006 |

(Continued)

OTHER PUBLICATIONS

Taiwan Office Action issued in corresponding Taiwan Application No. 107146876 dated May 13, 2022 (7 pages).
(Continued)

*Primary Examiner* — Derek J Rosenau
(74) *Attorney, Agent, or Firm* — Flynn Thiel, P.C.

(57) ABSTRACT

A bonded body includes a supporting substrate, a silicon oxide layer provided on the supporting substrate, and a piezoelectric material substrate provided on the silicon oxide layer and composed of a material selected from the group consisting of lithium niobate, lithium tantalate and lithium niobate-lithium tantalate. An average value of a nitrogen concentration of the silicon oxide layer is higher than a nitrogen concentration at an interface between the silicon oxide layer and supporting substrate and higher than a nitrogen concentration at an interface between the silicon oxide layer and piezoelectric material substrate.

6 Claims, 5 Drawing Sheets

(51) Int. Cl.
 *H03H 9/25* (2006.01)
 *H10N 30/072* (2023.01)
 *H10N 30/086* (2023.01)

(52) U.S. Cl.
 CPC ............ *H03H 9/25* (2013.01); *H10N 30/072* (2023.02); *H10N 30/086* (2023.02)

(58) Field of Classification Search
 USPC ...... 310/313 R, 313 A, 313 B, 313 C, 313 D
 See application file for complete search history.

(56) References Cited

U.S. PATENT DOCUMENTS

| | | |
|---|---|---|
| 2013/0285768 A1 | 10/2013 | Watanabe et al. |
| 2017/0298958 A1 | 10/2017 | Mochizuki et al. |
| 2017/0330747 A1 | 11/2017 | Akiyama |
| 2018/0175283 A1 | 6/2018 | Akiyama et al. |
| 2019/0036509 A1 | 1/2019 | Tai et al. |
| 2019/0288661 A1 | 9/2019 | Akiyama et al. |

FOREIGN PATENT DOCUMENTS

| | | |
|---|---|---|
| JP | 5910763 B2 | 4/2016 |
| JP | 2016225537 A | 12/2016 |
| JP | 201745676 A | 3/2017 |
| JP | 2017190744 A | 10/2017 |
| JP | 6250856 B1 | 12/2017 |
| WO | 2016088466 A1 | 6/2016 |
| WO | 2017163729 A1 | 9/2017 |

OTHER PUBLICATIONS

International Preliminary Report on Patentability and Written Opinion issued in corresponding International Application No. PCT/JP2018/041585, with English translation, dated Jul. 9, 2020 (16 pages).
Notice of Reasons for Refusal issued in corresponding Japanese Application No. 2019-511512, with English translation, dated Sep. 18, 2019 (6 pages).
International Search Report with English Translation issued in corresponding International Application No. PCT/JP2018/041585 dated Jan. 29, 2019 (5 pages).
Written Opinion of International Searching Authority issued in corresponding International Application No. PCT/JP2018/041585 dated Jan. 29, 2019 (5 pages).
Yoshikaju Zikuhara et al., Sequential activation process of oxygen RIE and nitrogen radical for LiTaO3 and Si wafer bonding, ECS Transactions, 3 (6) (2006) pp. 91-98.
T. Plach et al., Journal of Applied Physics 113, 094905, Mechanisms for room temperature direct wafer bonding, (2013) (8 pages).

ASSEMBLY OF PIEZOELECTRIC MATERIAL SUBSTRATE AND SUPPORT SUBSTRATE, AND METHOD FOR MANUFACTURING SAID ASSEMBLY

CROSS-REFERENCE TO RELATED APPLICATIONS

This application is a continuation application of PCT/JP2018/041585, filed Nov. 9, 2018, which claims priority to Japanese Application No. 2017-252851, filed Dec. 28, 2017, the entire contents all of which are incorporated hereby by reference.

TECHNICAL FIELD

The present invention relates to a bonded body of a piezoelectric material substrate and supporting substrate, an acoustic wave device and a method of producing the same.

BACKGROUND ARTS

It has been widely used an SOI substrate composed of a high resistance $Si/SiO_2$ thin film/Si thin film, for realizing a high-performance semiconductor device. Plasma activation is used for realizing the SOI substrate. This is because the bonding can be realized at a relatively low temperature (400° C.). It is proposed a composite substrate composed of similar $Si/SiO_2$ thin film/piezoelectric thin film for improving the characteristics of a piezoelectric device (patent document 1). According to patent document 1, the piezoelectric material substrate composed of lithium niobate or lithium tantalate and silicon substrate with the silicon oxide layer formed thereon are activated by ion activation method, followed by the bonding.

It is further proposed a filter of multi-layered structure by forming a single or multiple dielectric film at an interface (patent document 2).

However, there is few know information relating to the bonding technique for realizing the structure of lithium tantalate/silicon oxide/silicon.

Patent document 3 discloses that lithium tantalate and sapphire or ceramic are bonded through a silicon oxide layer by plasma activation method.

According to non-patent document 1, it is described that lithium tantalate substrate and a silicon substrate with a silicon oxide film provided thereon are bonded with each other by irradiating $O_2$ plasma of RIE (13.56 MHz) and microwave (2.45 GHz) of $N_2$ in series.

When Si and $SiO_2$/Si are bonded with each other by plasma activation, a sufficiently high bonding strength is obtained by the formation of Si—O—Si bond at the bonding interface. Further, at the same time, Si is oxidized to $SiO_2$ so that the flatness is improved and the bonding as described above is facilitated at the uppermost surface (Non-patent document 2).

RELATED TECHNICAL DOCUMENTS

Non-Patent Documents

Non-Patent Document 1

ECS Transactions, 3 (6) 91-98 (2006)

Non-Patent Document 2

J. Applied Physics 113, 094905 (2013)

PATENT DOCUMENTS (Patent document 1) Japanese Patent Publication No. 2016-225537A
(Patent document 2) Japanese Patent No. 5910763B
(Patent document 3) Japanese Patent No. 3774782B

SUMMARY OF THE INVENTION

As described in the prior documents, in the case that as piezoelectric device is produced by thinning a lithium niobate or lithium tantalate substrate by ion injection, the characteristics is low which is problematic. This is because that the crystallinity is deteriorated due to the damage during the ion injection.

On the other hand, in the case that a piezoelectric material substrate such as lithium niobate or lithium tantalate is bonded to a silicon oxide film on a silicon substrate and that the piezoelectric material substrate is then polished to make the substrate thinner, a processing denatured layer can be removed by CMP so that the device characteristics are not deteriorated. However, as the thickness of the piezoelectric material substrate is made smaller by polishing, the characteristics of the thus obtained bonded body may be deteriorated. Particularly in the case that the bonded body is used as an acoustic wave device, it is proved that the characteristics as an acoustic wave device, the electro-mechanical coupling factor k2, may be reduced. In the case that the thickness of the piezoelectric material substrate is 16.0 µm or smaller, further 12.0 µm or smaller (particularly 8.0 µm or smaller), the tendency of the reduction becomes more considerable.

An object of the present invention is, in bonding a piezoelectric material substrate of a material selected from the group consisting of lithium niobate, lithium tantalate and lithium-niobate-lithium tantalate and a supporting substrate, to suppress deterioration of characteristics of a bonded body.

The present invention provides a bonded body comprising:
  a supporting substrate;
  a silicon oxide layer provided on the supporting substrate; and
  a piezoelectric material substrate provided on the silicon oxide layer, the piezoelectric material substrate comprising a material selected from the group consisting of lithium niobate, lithium tantalate and lithium niobate-lithium tantalate,
  wherein an average value of a nitrogen concentration of the silicon oxide layer is higher than a nitrogen concentration at an interface between the silicon oxide layer and the supporting substrate and higher than a nitrogen concentration at an interface between the silicon oxide layer and the piezoelectric material substrate.

The present invention further provides an acoustic wave device comprising the bonded body and an electrode provided on the piezoelectric material substrate.

The present invention further provides a method of producing a bonded body of a piezoelectric material substrate comprising a material selected from the group consisting of lithium niobate, lithium tantalate and lithium niobate-lithium tantalate and a supporting substrate, said method comprising the steps of:

providing a first silicon oxide film on the piezoelectric material substrate;
providing a second silicon oxide film on the supporting substrate;
irradiating a plasma onto a bonding face of the first silicon oxide film and a bonding face of the second silicon oxide film at a temperature of 150° C. or lower to activate the bonding faces; and
then directly bonding the bonding face of the first silicon oxide film and the bonding face of the second silicon oxide film.

The present invention further provides a method of producing an acoustic wave device, the method comprising the step of:
providing an electrode on the piezoelectric material substrate after the bonded body is obtained according to the method described above.

The inventors have researched the reason that the characteristic of the bonded body is deteriorated when the piezoelectric material substrate composed of lithium niobate or the like and the supporting substrate are directly bonded with each other. Particularly, it is studied in detail the reason that a electro-mechanical coupling factor k2 is reduced. The following findings are thus obtained.

That is, in the case that Si and SiO$_2$/Si are bonded by plasma activation, for example, Si—O—Si bond is formed along the bonding interface, resulting in a sufficiently high bonding strength. Further, Si is oxidized into SiO$_2$ at the same time, so that the flatness is improved and the bonding as described above is facilitated at the uppermost surface (non-patent document 2: J. Applied Physics 113, 094905 (2013)).

Contrary to this, in the case that lithium niobate or lithium tantalate is directly bonded to the supporting substrate with the silicon oxide layer formed thereon, Ta—(Nb)—O—Si bond is formed along the bonding interface to perform the bonding. However, the density of Si atoms at the uppermost surface of SiO$_2$/Si is 6.8 counts/Å$^2$. On the other hand, the density of Ta(Nb) atoms at the uppermost surface of the piezoelectric material substrate is 4.3 counts/Å$^2$ or lower, for example, indicating that the atomic density at the uppermost surface is low, although the density is dependent on the cut angle as the crystal belongs to anisotropic crystal. Further, it is considered that lithium niobate or lithium tantalate does not have the mechanism of smoothening by oxidation, different from silicon, and that a sufficiently high bonding strength is thus not obtained.

It is thus considered as follows. In the case that a piezoelectric material substrate composed of lithium niobate or lithium tantalate is processed after the piezoelectric material substrate is directly bonded to SiO$_2$/Si, as the piezoelectric material substrate becomes thinner, a shear force is applied on the piezoelectric material, resulting in the deterioration of the crystallinity of the piezoelectric material.

Based on such hypothesis, the inventors have tried to provide a silicon oxide layer between the piezoelectric material substrate and supporting substrate and to provide a part having a relatively high nitrogen concentration in the silicon oxide layer. It is thus found that the reduction of characteristic due to the deterioration of crystallinity of the piezoelectric material can be suppressed. The present invention is thus made.

Further, a first silicon oxide film is provided on the piezoelectric material substrate, a second silicon oxide film is provided on the supporting substrate, plasma is irradiated onto the respective bonding faces of the respective silicon oxide films at a temperature of 150° C. or lower to activate them and the bonding faces of the respective silicon oxide films are then directly bonded with each other, so that a region having a relatively high nitrogen concentration ca be easily generated in the silicon oxide layer between the piezoelectric material substrate and supporting substrate.

EMBODIMENTS FOR CARRYING OUT THE INVENTION

Figure 1A:
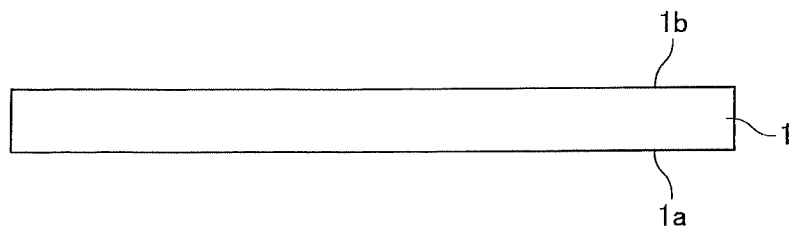
FIG. 1(a) shows a piezoelectric material substrate 1.

The present invention will be described in detail below, appropriately referring to the drawings.

Figure 1B:
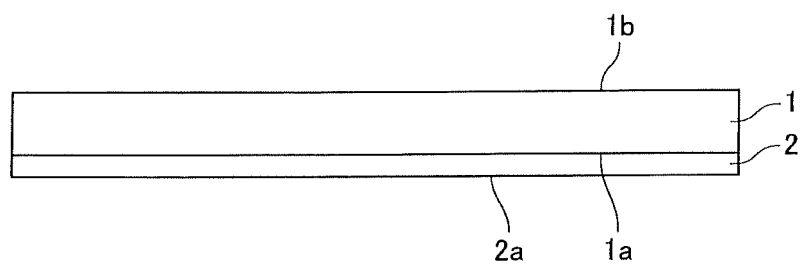
FIG. 1(b) shows the state that a first silicon oxide film 2 is provided on the piezoelectric material substrate 1 and FIG. 1(c) shows the state that a bonding face 2a of the silicon oxide film 2 is activated to generate an activated face 5.
Figure 1C:
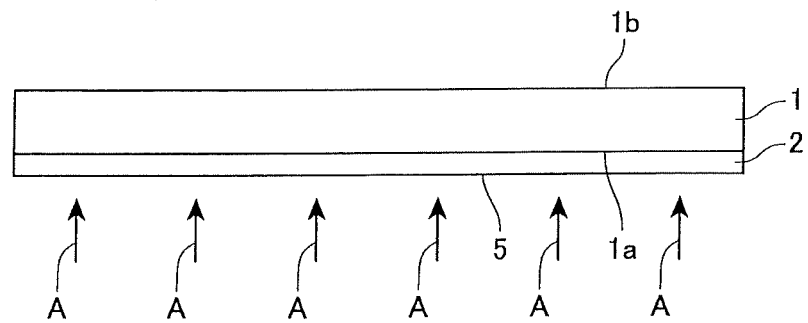

First, as shown in FIG. 1(a), it is prepared a piezoelectric material substrate 1 having a pair of main faces 1a and 1b. Then, as shown in FIG. 1(b), a first silicon oxide film 2 is film-formed on the first main face 1a of the piezoelectric material substrate 1. Plasma is then irradiated onto the bonding face 2a of the silicon oxide film 2 as arrows A to obtain a surface activated bonding face 5, as shown in FIG. 1(c).

Figure 2A:
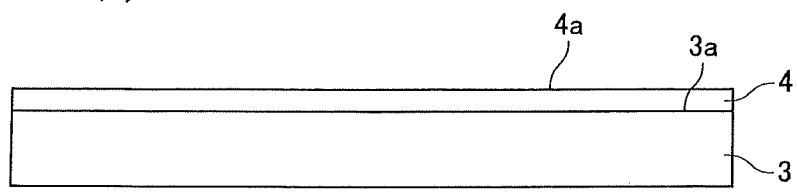
FIG. 2(a) shows the state that a second silicon oxide film 4 is formed on a surface 3a of a supporting substrate 3.
Figure 2B:
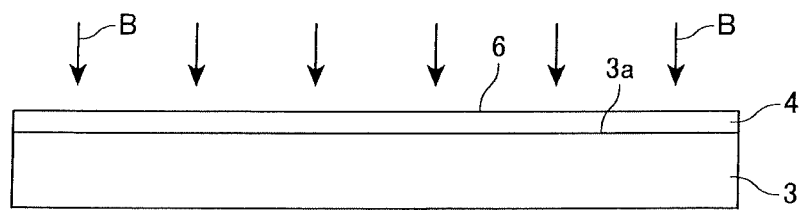
FIG. 2(b) shows the state that the surface of the silicon oxide film 4 is activated.

Further, as shown in FIG. 2(a), a second silicon oxide film 4 is film-formed on a surface 3a of the supporting substrate 3. Plasma is then irradiated onto the surface 4a of the silicon oxide film 4 as arrows B to perform the surface activation and to obtain a surface activated bonding face 6, as shown in FIG. 2(b).

Figure 3A:
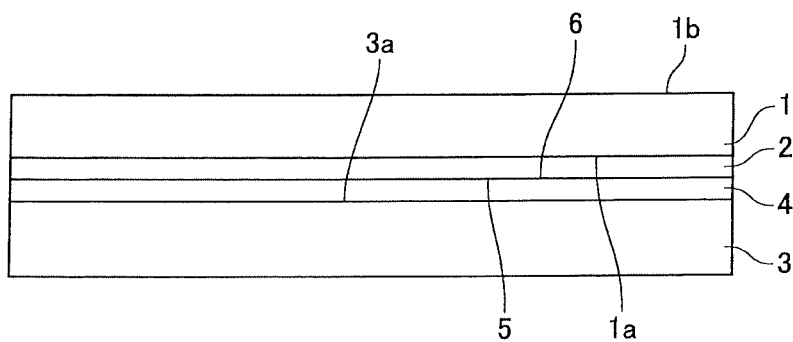
FIG. 3(a) shows the state that the first silicon oxide film 2 on the piezoelectric material substrate 1 and the second silicon oxide film 4 on the supporting substrate 3 are directly bonded with each other.
Figure 3B:
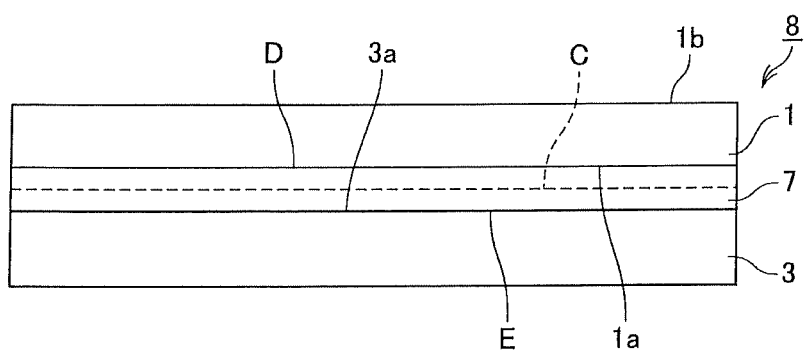
FIG. 3(b) shows a bonded body 8 obtained by the direct bonding.

Then, as shown in FIG. 3(a), the activated bonding face 5 of the first silicon oxide film 2 and the activated surface 6 of the second silicon nitride film 4 are contacted to each other for performing the direct bonding to obtain a bonded body 8 shown in FIG. 3(b). Here, the first silicon oxide film 2 and second silicon oxide film 4 are integrated by direct bonding to generate a silicon oxide layer 7. C represents an interface between the first silicon oxide layer 2 and second silicon oxide layer 4 before the bonding.

Figure 4A:
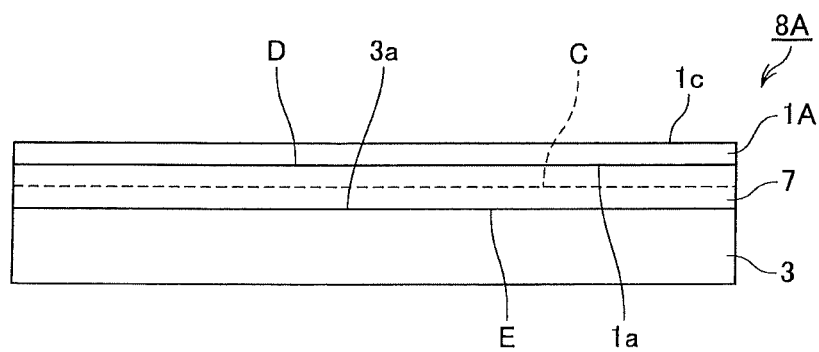
FIG. 4(a) shows the state that a piezoelectric material substrate 1A of a bonded body 8A is thinned by polishing.
Figure 4B:
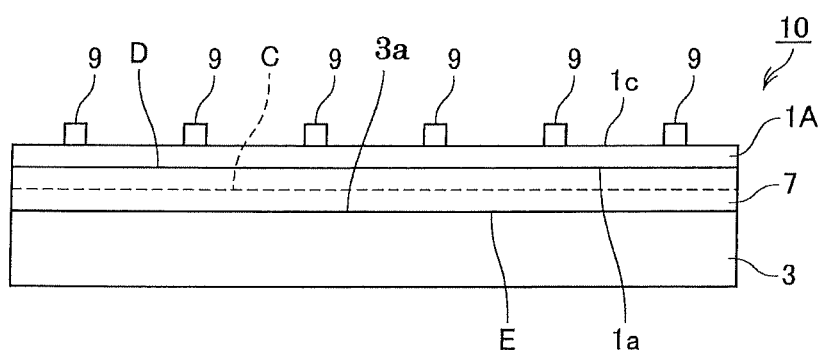
FIG. 4(b) shows an acoustic wave device 10.

At this state, an electrode may be provided on the piezoelectric material substrate 1. However, preferably, as shown in FIG. 4(a), the main face 1b of the piezoelectric material substrate 1 is processed for thinning the substrate 1 to obtain a thinned piezoelectric material substrate 1A. 1c represents a processed face. Then, as shown in FIG. 4(b), a predetermined electrode 9 is formed on the processed face 1c of the piezoelectric material substrate 1A of a bonded body 8A to obtain an acoustic wave device 10.

According to the present invention, the average value N7 of the nitrogen concentration in the silicon oxide layer 7 (refer to FIG. 3) is higher than the nitrogen concentration ND at the interface D between the silicon oxide layer 7 and piezoelectric material substrate 1 or 1A and higher than the nitrogen concentration NE at the interface E between the silicon oxide layer 7 and supporting substrate 3. This indicates that there is the region having a relatively high nitrogen concentration in the silicon nitride layer 7, particularly in a bonding region C of the silicon oxide layer 7.

Here, the ratio (N7/ND) and the ratio (N7/NE) of the average value N7 of the nitrogen concentration in the silicon oxide layer 7 with respect to the nitrogen concentration ND at the interface D between the silicon oxide layer 7 and piezoelectric material substrate 1 or 1A and with respect to the nitrogen concentration NE at the interface E between the silicon oxide layer 7 and supporting substrate 3 may preferably be 10 or higher, and more preferably be 50 or higher, respectively. Further, the ratio (N7/ND) and ratio (N7/NE) may preferably be 1000 or lower on the practical viewpoint.

According to a preferred embodiment, the average value N7 of the nitrogen concentration in the silicon oxide layer 7 may preferably be 5E18 to 2E20 atoms/cm$^3$, and more preferably be 1E19 to 5E19 atoms/cm$^3$. Then, 1E19" means "$1\times10^{19}$" and the other values are similarly represented. Further, the nitrogen concentration ND at the interface D between the silicon oxide layer 7 and piezoelectric material substrate 1 may preferably be 1E1 atoms/cm$^3$ or lower and more preferably be 7E18 atoms/cm$^3$ or lower. Further, the nitrogen concentration NE at the interface E between the silicon oxide layer 7 and supporting substrate 3 may preferably be 1E19 atoms/cm$^3$ or lower and more preferably be 7E18 atoms/cm$^3$ or lower.

Further, according to a preferred embodiment, the average value C7 of the carbon concentration of the silicon oxide layer 7 is higher than the carbon concentration CD at the interface D between the silicon oxide layer 7 and piezoelectric material substrate 1 or 1A and higher than the carbon concentration CE at the interface E between the silicon oxide layer 7 and supporting substrate 3. This indicates that there is the region having a relatively high carbon concentration in the silicon nitride layer 7, particularly in the bonding region C of the silicon oxide layer 7.

According to a preferred embodiment, the ratios (C7/CD) and (C7/CE) of the average value C7 of the carbon concentration of the silicon oxide layer 7 with respect to the carbon concentration CD at the interface D between the silicon oxide layer 7 and piezoelectric material substrate 1 or 1A and with respect to the carbon concentration CE at the interface E between the silicon oxide layer 7 and supporting substrate 3 may preferably be 10 or higher and more preferably be 50 or higher, respectively. Further, the ratios (C7/CD) and (C7/CE) may preferably be 1000 or lower on the practical viewpoint.

According to a preferred embodiment, the average value C7 of the carbon concentration of the silicon oxide layer 7 may preferably be 5E18 to 5E20 atoms/cm$^3$, and more preferably be 7E18 to 5E19 atoms/cm$^3$. Further, the carbon concentration CD at the interface D between the silicon oxide layer 7 and piezoelectric material substrate 1 or 1A may preferably be 3E18 atoms/cm$^3$ or lower and more preferably be 1E18 atoms/cm$^3$ or lower. Further, the carbon concentration CE at the interface E between the silicon oxide layer 7 and supporting substrate 3 may preferably be 3E18 atoms/cm$^3$ or lower and more preferably be 1E18 atoms/cm$^3$ or lower.

Further, according to a preferred embodiment, the average value F7 of the fluorine concentration of the silicon oxide layer 7 is higher than the fluorine concentration FD at the interface D between the silicon oxide layer 7 and piezoelectric material substrate 1 or 1A and higher than the fluorine concentration FE at the interface E between the silicon oxide layer 7 and supporting substrate 3. This means that there is the region having a relatively high fluorine concentration in the silicon oxide layer 7, particularly around the bonding region C of the silicon oxide layer 7.

According to the present embodiment, the ratio (F7/FD) and the ratio (F7/FE) of the average value F7 of the fluorine concentration of the silicon oxide layer 7 with respect to the fluorine concentration FD at the interface D between the silicon oxide layer 7 and piezoelectric material substrate 1 or 1A and with respect to the fluorine concentration FE at the interface E between the silicon oxide layer 7 and supporting substrate 3 may preferably be 3 or higher and more preferably be 30 or higher, respectively. Further, the ratio (F7/FD) and ratio (F7/FE) may preferably be 300 or lower on the practical viewpoint.

According to a preferred embodiment, the average value F7 of the fluorine concentration of the silicon oxide layer 7 may preferably be 5E18 to 8E19 atoms/cm$^3$, and more preferably be 8E18 to 7E19 atoms/cm$^3$. Further, the fluorine concentration FD at the interface D between the silicon oxide layer 7 and piezoelectric material substrate 1 or 1A may preferably be 3E18 atoms/cm$^3$ or lower and more preferably be 1E18 atoms/cm$^3$ or lower. Further, the fluorine concentration FE at the interface E between the silicon oxide layer 7 and supporting substrate 3 may preferably be 3E18 atoms/cm$^3$ or lower and more preferably be 1E18 atoms/cm$^3$ or lower.

The respective constituents of the present invention will be described further in detail below.

Although the material of the supporting substrate 3 is not particularly limited, preferably, the material is selected from the group consisting of silicon, quartz, sialon, mullite, sapphire and translucent alumina. It is thus possible to further improve the temperature characteristics of frequency of an acoustic wave device 10.

The first silicon oxide film 2 is formed on the piezoelectric material substrate 1, and the second silicon oxide film 4 is formed on the supporting substrate 3. Although the method of film-forming the silicon oxide layers 2 and 4 is not particularly limited, sputtering, chemical vapor deposition (CVD) and vapor deposition may be listed. Preferably, the supporting substrate 3 is a silicon substrate, and in this case, the silicon oxide layers 2 and 4 can be formed by sputtering of oxygen or ion injection onto the surface of the silicon substrate, or by heating under oxidizing atmosphere.

The thicknesses of the first silicon oxide layer 2 and second silicon oxide film 4 may preferably be 0.05 μm or larger, more preferably be 0.1 μm or larger and particularly preferably be 0.2 μm or larger, on the viewpoint of the present invention. Further, the thicknesses of the respective silicon oxide layers 2 and 4 may preferably be 3 μm or smaller, preferably 2.5 μm or smaller and more preferably be 2.0 μm or smaller.

The piezoelectric material substrate 1 (1A) used in the present invention is made single crystals of lithium tantalate (LT), lithium niobate (LN) or lithium niobate-lithium tantalate solid solution. As the materials have high propagation speeds of a surface acoustic wave and large electro-mechanical coupling factors, it is preferred for use in a piezoelectric surface wave device for high frequency and wideband frequency applications.

Further, the normal direction of the main surface of the piezoelectric single crystal substrate 1 (1A) is not limited. For example, in the case that the piezoelectric single crystal substrate 1 (1A) is made of LT, it is preferred to use the substrate rotated from Y-axis toward Z-axis by 32 to 50° (180°, 58° to 40°, 180° on Eulerian angle representation) around X-axis, which is a direction of propagation of a surface acoustic wave, because of a low propagation loss. In the case that the piezoelectric single crystal substrate 1 (1A) is made of LN, (i) it is preferred to use the substrate rotated from Z-axis toward −Y-axis by 37.8° (0°, 37.8°, 0° on Eulerian angle representation) around X-axis, which is a direction of propagation of a surface acoustic wave, because of a large electro-mechanical coupling factor. Alternatively, (ii) it is preferred to use the substrate rotated from Y-axis toward Z-axis by 40 to 65° (180°, 50 to 25°, 180° on Eulerian angle representation) around X-axis, which is a direction of propagation of a surface acoustic wave, because a high acoustic speed can be obtained. Further, although the size of the piezoelectric material substrate 1 (1A) is not particularly limited, for example, the diameter may be 100 to 200 mm and thickness may be 0.15 to 1p m.

Plasma is then irradiated onto the bonding faces of the respective silicon oxide films 2 and 4 at a temperature of 150° C. or lower to activate the bonding faces 2a and 4a. Although it is preferred to irradiate nitrogen plasma on the viewpoint of the present invention, the bonded body 8 of the present invention can be obtained even in the case that oxygen plasma is irradiated.

The pressure during the surface activation may preferably be 100 Pa or lower and more preferably be 80 Pa or lower. Further, the atmosphere may be composed of nitrogen only, oxygen only, or mixture of nitrogen and oxygen.

The temperature during the irradiation of the plasma is made 150° C. or lower. It is thereby possible to obtain the bonded body 8 having a high bonding strength and without deterioration of the crystallinity. On the viewpoint, the temperature during the plasma irradiation is made 150° C. or lower and may more preferably be 100° C. or lower.

Further, the energy of the irradiated plasma may preferably be 30 to 150 W. Further, a product of the energy of the irradiated plasma and irradiation time period may preferably be 0.12 to 1.0 Wh.

According to a preferred embodiment, the bonding faces 2a and 4a of the first silicon oxide film 2 and second silicon oxide film 4 are subjected to flattening process before the plasma treatment. The method of flattening the respective bonding faces includes lapping, chemical mechanical polishing (CMP) and the like. Further, the flattened face may preferably have Ra of 1 nm or lower and more preferably have Ra of 0.3 nm or lower.

The bonding face 5 of the piezoelectric material substrate 1 and bonding face 6 of the silicon oxide layer 4 are then contacted and bonded with each other. Thereafter, it is preferred to perform the annealing treatment to improve the bonding strength. The temperature during the annealing treatment may preferably be 100° C. or higher and 300° C. or lower.

The bonded bodies 8 and 8A of the present invention may preferably be applied as an acoustic wave device 10.

As the acoustic wave device 10, a surface acoustic wave device, Lamb wave-type device, thin film resonator (FBAR) or the like is known. For example, the surface acoustic wave device is produced by providing an input side IDT (Inter-digital transducer) electrodes (also referred to as comb electrodes or interdigitated electrodes) for oscillating surface acoustic wave and IDT electrode on the output side for receiving the surface acoustic wave on the surface of the piezoelectric single crystal substrate. By applying high frequency signal on the IDT electrode on the input side, electric field is generated between the electrodes, so that the surface acoustic wave is oscillated and propagated on the piezoelectric substrate. Then, the propagated surface acoustic wave is drawn as an electrical signal from the IDT electrodes on the output side provided in the direction of the propagation.

A material forming the electrode 9 of the piezoelectric material substrate 1 or 1A may preferably be aluminum, an aluminum alloy, copper or gold, and more preferably be aluminum or the aluminum alloy. The aluminum alloy may preferably be Al with 0.3 to 5 weight % of Cu mixed therein. In this case, Ti, Mg, Ni, Mo or Ta may be used instead of Cu.

EXAMPLES

Inventive Example A1

It was produced an acoustic wave device 10 shown in FIG. 4(b), according to the method described referring to FIGS. 1 to 4.

Specifically, it was prepared a 42Y-cut X-propagation LiTaO$_3$ substrate (piezoelectric material substrate) 1 having a thickness of 200 μm and both main faces polished into mirror surfaces and a high-resistance (>2 kΩ·cm) Si (100) substrate (supporting substrate) 3 having a thickness of 675 μm. Both substrates have sizes of 150 mm, respectively. Silicon oxide layers 2 and 4 were film-formed by sputtering in thicknesses of 250 nm on the piezoelectric material substrate 1 and supporting substrate 3, respectively. As the silicon oxide layers 2 and 4 after the film-formation had surface roughnesses Ra of 0.6 nm, the surfaces were slightly polished by CMP (Chemical mechanical polishing) so that Ra was improved to 0.3 nm.

The bonding face 2a of the silicon oxide film 2 on the piezoelectric material substrate 1 and the bonding face 4a of the silicon oxide film 4 on the supporting substrate were subjected to cleaning and surface activation, respectively. Specifically, ultrasonic cleaning using pure water was performed, and the substrate surfaces were dried by spin dry.

The supporting substrate 3 after the cleaning was then introduced into a plasma activation chamber, and the bonding face 4a of the silicon oxide film 4 was activated by nitrogen gas plasma at 30° C. Further, the piezoelectric material substrate 1 was similarly introduced into the plasma activation chamber, and the bonding face 2a of the silicon oxide film 2 was subjected to surface activation by nitrogen gas plasma at 30° C. The time period of the surface activation was made 40 seconds and the energy was made 100 W. The ultrasonic cleaning and spin dry as described above were performed again for removing particles adhered during the surface activation.

Then, the positioning of the respective substrates 1 and 3 was then performed, and the bonding faces 5 and 6 of the silicon oxide films were contacted with each other at room temperature. The substrates were contacted with the piezoelectric material substrate 1 positioned upper side. As a result, it was observed the state (so called-bonding wave) that the adhesion of the silicon oxide films was spreading, indicating that good preliminary bonding was completed. Then, the bonded body 8 was charged into an oven filled with nitrogen atmosphere and held at 120° C. for 10 hours, for improving the bonding strength.

The nitrogen concentrations, carbon concentrations and fluorine concentrations at the respective parts were measured using SIMS method (secondary ion mass spectroscopy) for the thus obtained bonded bodies 8. As the SIMS measuring system, "CAMECA IMS-7f" was used, Cs+ was used as primary ion specie, and the primary acceleration voltage was made 15.0 kV. The detection region was made 30 μmφ. The results were shown in table 1.

Figure 5:
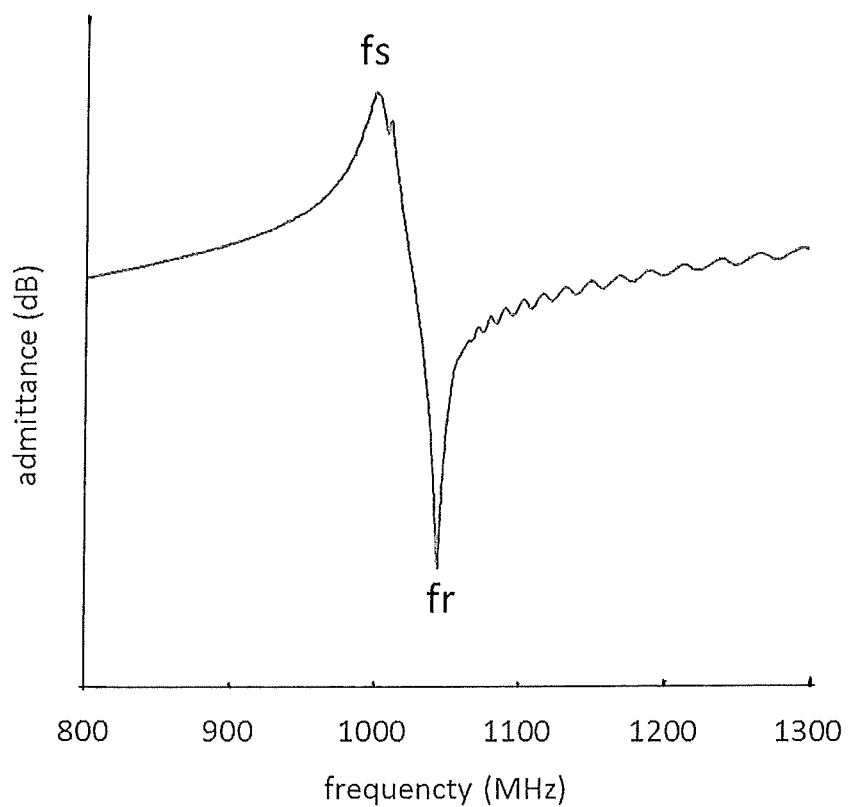
FIG. 5 shows a graph showing typical resonance characteristics of a SAW resonator.

The surface 1b of the piezoelectric material substrate 1 of the bonded body 8 after the heating was subjected to grinding, lapping and CMP processing, so that the thickness of the piezoelectric material substrate 1A was made 16, 8, 4, 2 or 1 μm. The thickness of the piezoelectric material substrate 1A was measured by an optical measurement system ("F20" supplied by Filmetrix Corporation) applying optical interference. An IDT electrode 9 made of aluminum metal was provided on the surface 1c of the polished piezoelectric material substrate 1A by photolithography process. The period λ of the electrode was made 4 μm, so that oscillation frequency becomes about 1000 MHz. The thickness of the IDT electrode 9 was made 200 nm and it was provided 80 pairs of reflectors on both sides of the 200 pairs of IDT electrodes 9, respectively, to produce an acoustic wave device 10 (SAW resonator) of 1 port. The impedance characteristics of the thus produced acoustic wave device (SAW resonator) 10 was measured by a network analyzer "E5071C" supplied by Agilent Corporation. FIG. 5 shows typical resonance characteristics. It was observed a resonance peak around 1000 MHz (fs) and an anti-resonance peak around 1050 MHz (fr). It was measured a difference Lf between the resonance frequency fs and anti-resonance frequency fr. It is known that the difference Δf is generally proportional to the electro-mechanical coupling factor k2 of the piezoelectric device. The results were shown in table 3.

Inventive Example A2

In the inventive example A1, plasma of mixed gases of 80 percent of nitrogen gas and 20 percent of oxygen gas was used instead of nitrogen plasma. When the gas composition was changed, the matching was appropriately changed so that the reflection electric power took the minimum value. The other conditions of the experiment were the same as those in the inventive example A1.

The nitrogen concentrations, carbon concentrations and fluorine concentrations at the respective parts of the thus obtained bonded body 8 were measured according to the same procedure ad the inventive example A1 and the measurement results were shown in table 1. Further, according to same procedure as the inventive example A1, the piezoelectric material substrates 1 and 1A were processed to a thickness of 16, 8, 4, 2 and 1 μm, and it was measured the difference Δf between the resonance frequency fs and anti-resonance frequency fr. It is known that the difference Δf is generally proportional to the electro-mechanical coupling factor k2 of the piezoelectric device. The results were shown in table 3.

Comparative Example 1

According to the same procedure as the inventive example A1, the bonded bodies 8, 8A and acoustic wave device 10 (SAW device) were produced, and the measurement as the inventive example A1 was performed. However, the silicon oxide layer 2 was film-formed on the piezoelectric material substrate 1 and was not formed on the side of the supporting substrate 3. Further, the surface activation of the silicon oxide film 2 and supporting substrate 3 was performed, and the activated surfaces of the silicon oxide film 2 and supporting substrate 3 were directly bonded with each other by irradiating nitrogen plasma.

The nitrogen concentrations, carbon concentrations and fluorine concentrations at the respective parts in the thus obtained bonded bodies 8 were measured, and the measurement results were shown in table 2. Further, according to the same procedure as the inventive example A1, the processing was performed so that the thickness of the piezoelectric material substrate was made 16, 8, 4, 2 or 1μ m, and Δf was measured. The results were shown in table 3.

TABLE 1

| | Measurement position | Nitrogen concentration atoms/cm$^3$ | Carbon concentration atoms/cm$^3$ | Fluorine concentration atoms/cm$^3$ |
|---|---|---|---|---|
| Inventive Example A1 | Interface between piezoelectric material substrate and silicon oxide layer | 5.1E18 | 5.5E17 | 1.5E18 |
| | Average value in silicon oxide layer | 1.9E20 | 4.5E20 | 6.9E19 |
| | Interface between supporting substrate and silicon oxide layer | 7.7E18 | 8.1E17 | 1.3E18 |
| Inventive Example A2 | Interface between piezoelectric material substrate and silicon oxide layer | 5.7E18 | 2.6E17 | 9.9E17 |
| | Average value in silicon oxide layer | 9.8E19 | 3.1E20 | 2.2E19 |
| | Interface between supporting substrate and silicon oxide layer | 6.2E18 | 4.5E17 | 1.6E18 |

TABLE 2

| | Measurement position | Nitrogen concentration atoms/cm$^3$ | Carbon concentration atoms/cm$^3$ | Fluorine concentration atoms/cm$^3$ |
|---|---|---|---|---|
| comparative Example A1 | Interface between piezoelectric material substrate and silicon oxide layer | 2.9E18 | 3.2E17 | 2.4E18 |
| | Average value in silicon oxide layer | 3.6E18 | 1.2E17 | 8.7E17 |
| | Interface between supporting substrate and silicon oxide layer | 1.7E20 | 1.4E20 | 2.1E19 |

TABLE 3

| | Δf (MHz) | | |
|---|---|---|---|
| Thickness of piezoelectric material substrate | Inventive Example A1 | Inventive Example A2 | Comparative Example A1 |
| 16.0 | 40.0 | 39.8 | 41.4 |
| 8.0 | 41.2 | 38.8 | 40.8 |
| 4.0 | 39.2 | 40.5 | 38.5 |
| 2.0 | 40.5 | 40.2 | 37.3 |
| 1.0 | 39.3 | 39.9 | 34.5 |

As shown in table 3, according to the acoustic wave devices 10 (SAW devices) using the bonded bodies 7 and 7A of the present invention, even in the case that the thickness of the piezoelectric material substrate 1A was made as extremely thin as 2.0 to 1.0 µm by processing, the electromechanical coupling factor k2 was not deteriorated and was good. On the other hand, according to the bonded body 8A of the comparative example, as the thickness of the piezoelectric material substrate 1A becomes smaller, the electromechanical coupling factor k2 was deteriorated.

Inventive Example B

In the inventive example A1, the materials of the piezoelectric material substrates 1 and 1A were changed to lithium niobate. As a result, it was obtained results similar to those obtained in the inventive example A1.

The invention claimed is:

1. A bonded body comprising:
   a supporting substrate;
   a silicon oxide layer provided on said supporting substrate; and
   a piezoelectric material substrate provided on said silicon oxide layer, said piezoelectric material substrate comprising a material selected from the group consisting of lithium niobate, lithium tantalate and lithium niobate-lithium tantalate,
   wherein an average value of a nitrogen concentration of said silicon oxide layer is higher than a nitrogen concentration at an interface between said silicon oxide layer and said supporting substrate and higher than a nitrogen concentration at an interface between said silicon oxide layer and said piezoelectric material substrate, and
   wherein an average value of a carbon concentration of said silicon oxide layer is higher than a carbon concentration at said interface between said silicon oxide layer and said supporting substrate and higher than a carbon concentration at said interface between said silicon oxide layer and said piezoelectric material substrate.

2. The bonded body of claim 1, wherein an average value of a fluorine concentration of said silicon oxide layer is higher than a fluorine concentration at said interface between said silicon oxide layer and said supporting substrate and higher than a fluorine concentration at said interface between said silicon oxide layer and said piezoelectric material substrate.

3. The bonded body of claim 1, wherein said piezoelectric material substrate has a thickness of 4.0 µm or smaller.

4. A bonded body comprising:
   a supporting substrate;
   a silicon oxide layer provided on said supporting substrate; and
   a piezoelectric material substrate provided on said silicon oxide layer, said piezoelectric material substrate comprising a material selected from the group consisting of lithium niobate, lithium tantalate and lithium niobate-lithium tantalate,
   wherein an average value of a nitrogen concentration of said silicon oxide layer is higher than a nitrogen concentration at an interface between said silicon oxide layer and said supporting substrate and higher than a nitrogen concentration at an interface between said silicon oxide layer and said piezoelectric material substrate, and
   wherein an average value of a fluorine concentration of said silicon oxide layer is higher than a fluorine concentration at said interface between said silicon oxide layer and said supporting substrate and higher than a fluorine concentration at said interface between said silicon oxide layer and said piezoelectric material substrate.

5. The bonded body of claim 4, wherein an average value of a carbon concentration of said silicon oxide layer is higher than a carbon concentration at said interface between said silicon oxide layer and said supporting substrate and higher than a carbon concentration at said interface between said silicon oxide layer and said piezoelectric material substrate.

6. The bonded body of claim 4, wherein said piezoelectric material substrate has a thickness of 4.0 µm or smaller.

* * * * *